US012610817B2

(12) United States Patent
Li et al.

(10) Patent No.: US 12,610,817 B2
(45) Date of Patent: Apr. 21, 2026

(54) METAL MATRIX COMPOSITE LAYERS FOR HEAT DISSIPATION FROM INTEGRATED CIRCUIT DEVICES

(71) Applicant: Intel Corporation, Santa Clara, CA (US)

(72) Inventors: Wenhao Li, Chandler, AZ (US); Feras Eid, Chandler, AZ (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 903 days.

(21) Appl. No.: 17/685,060

(22) Filed: Mar. 2, 2022

(65) Prior Publication Data

US 2023/0282542 A1    Sep. 7, 2023

(51) Int. Cl.
H01L 23/373        (2006.01)

(52) U.S. Cl.
CPC ...... H01L 23/3733 (2013.01); H01L 23/3732 (2013.01)

(58) Field of Classification Search
None
See application file for complete search history.

(56) References Cited

U.S. PATENT DOCUMENTS

| | | | |
|---|---|---|---|
| 2005/0189647 A1* | 9/2005 | Sung | H01L 23/373 257/E23.11 |
| 2009/0136707 A1* | 5/2009 | Ueno | C22C 49/14 428/113 |
| 2016/0146556 A1* | 5/2016 | Chauhan | B22F 1/0553 428/312.8 |
| 2018/0328677 A1* | 11/2018 | Kim | H01L 23/3735 |
| 2021/0118771 A1* | 4/2021 | Lee | H01L 23/3736 |

* cited by examiner

*Primary Examiner* — Nilufa Rahim

(74) *Attorney, Agent, or Firm* — Essential Patents Group, LLP

(57) ABSTRACT

An integrated circuit assembly may be fabricated to include an integrated circuit device having a backside surface and a metal matrix composite layer on the backside surface, wherein the metal matrix composite layer has a filler material disposed therein to reduce the coefficient of thermal expansion thereof. The filler material may be a plurality of graphitic carbon filler particles, wherein the plurality of graphitic carbon filler particles has an average aspect ratio of greater than about 10, or the filler material may be a plurality of diamond particles, wherein the filler material is clad with a metal material.

9 Claims, 5 Drawing Sheets

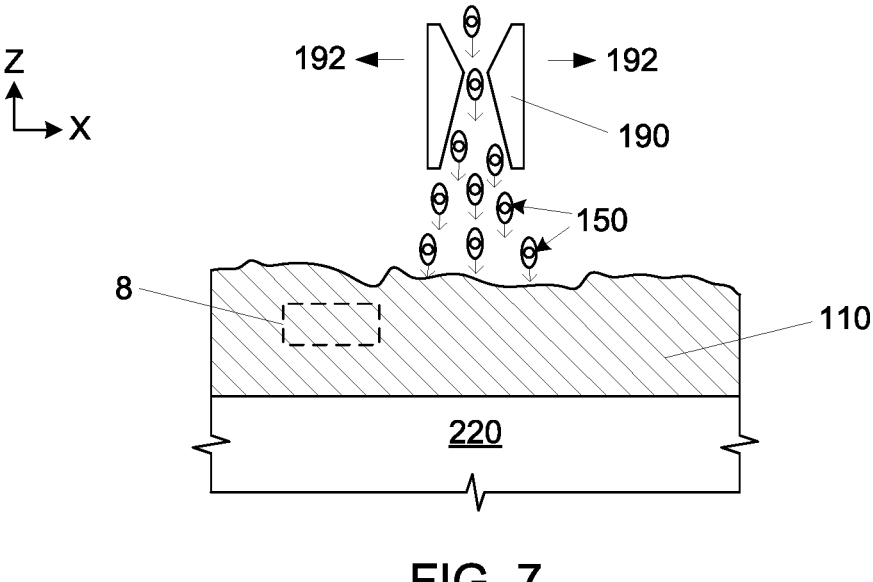
FIG. 7
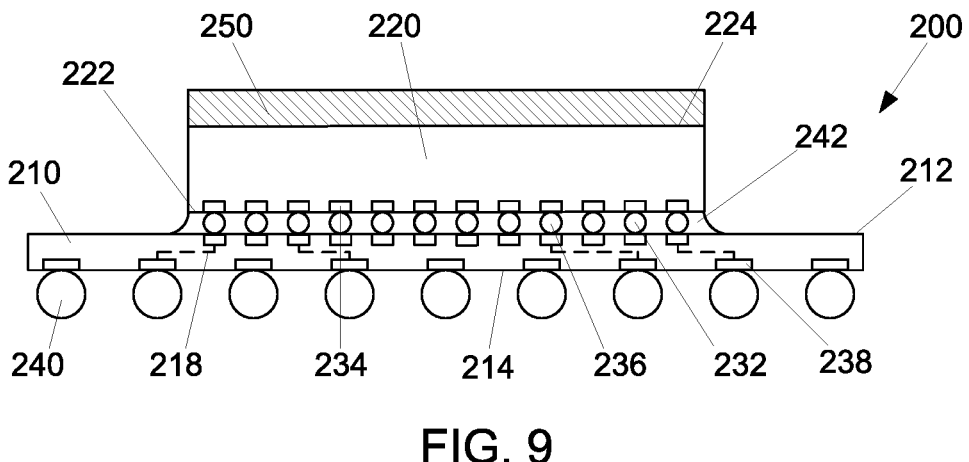
FIG. 8
FIG. 9

METAL MATRIX COMPOSITE LAYERS FOR HEAT DISSIPATION FROM INTEGRATED CIRCUIT DEVICES

TECHNICAL FIELD

Embodiments of the present description generally relate to the removal of heat from integrated circuit devices, and, more particularly, to thermal management solutions wherein a metal matrix composite layer having a filler material to reduce coefficient of thermal expansion mismatch is formed on an integrated circuit device.

BACKGROUND

The integrated circuit industry is continually striving to produce ever faster, smaller, and thinner integrated circuit (IC) devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of circuits within the integrated circuit devices has increased, which, in turn, increases the average junction temperature of the integrated circuit device. If the temperature of the integrated circuit device becomes too high, the circuits therein may be damaged or destroyed. Thus, heat dissipation devices are used to remove heat from the integrated circuit devices in an integrated circuit package. In one example of an integrated circuit package, at least one integrated circuit device may be mounted to an electronic substrate and the heat dissipation device may be thermally attached to the at least one integrated circuit device with a thermal interface material ("TIM") that is disposed between the integrated circuit device(s) and the heat dissipation device to form thermal contact therebetween. The thermal interface material may include thermal greases, gap pads, polymers, and the like.

Since the thermal interface material provides a heat transfer path from the integrated circuit device(s) to the heat dissipation device, the thermal efficiency of the thermal interface material is critical to effectively remove heat from the integrated circuit device(s). Thus, the thermal interface material should have a thermal conductivity that is higher than the primary material of the integrated circuit device(s), such as silicon. However, even the best thermal interface materials have thermal conductivities that are lower than silicon, which results in the thermal interface material becoming a thermal bottleneck.

One method of eliminating the deficiencies of thermal interface materials is to simply remove them by depositing films with higher thermal conductivity than silicon directly on the integrated circuit device, such as on the backside thereof, to help improve thermal management. Metal films, such as copper, demonstrate high thermal conductivity, but larger coefficient of thermal expansion ("CTE") than silicon. Such a mismatch in the coefficient of thermal expansion may create thermomechanical stresses at the interface of the integrated circuit device and the metal films, which can lead to potential cracking and failure of the integrated circuit device. Additionally, most deposition techniques used to form metal films are generally incompatible with the integrated circuit devices, as they require sintering with temperatures exceeding 500 degrees Celsius, which can damage the integrated circuit devices.

Thus, there is a need to overcome the shortcomings of forming metal films on integrated circuit devices for thermal management.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIG. 7 are side cross-sectional view of forming a metal matrix composite layer on a substrate, according to an embodiment of the present description.

FIG. 8 is a side cross-sectional view of the inset 8 for FIG. 7, according to one embodiment of the present description.

FIG. 9 is a side cross-sectional view of an integrated circuit assembly, according to an embodiment of the present description.

DETAILED DESCRIPTION

Figure 1:
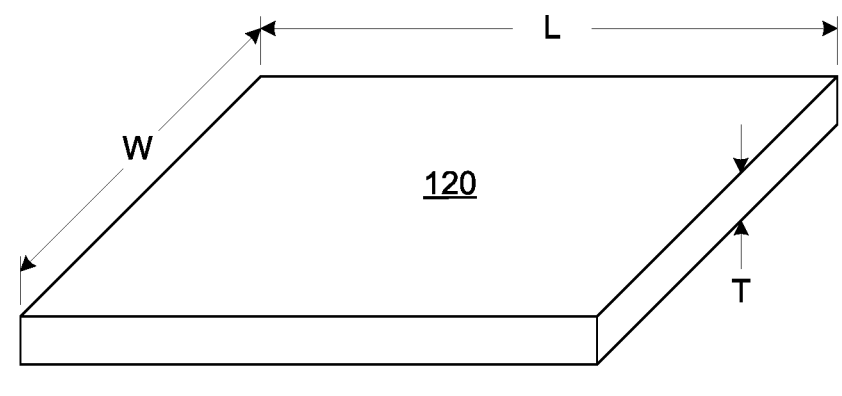
FIG. 1 is an oblique view of a graphitic carbon filler particle, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of a metal matrix composite layer on a backside surface of an integrated circuit device, wherein the metal matrix composite layer has a filler material disposed therein to reduce the coefficient of thermal expansion thereof. In one embodiment of the present description, the filler material may be a plurality of graphitic carbon filler particles, wherein the plurality of graphitic carbon filler particles has an average aspect ratio of greater than about 10. In another embodiment of the present description, the filler material may be a plurality of diamond particles, wherein the filler material is clad with a metal material.

As shown in FIG. 1, in one embodiment of the present description, a single particle of a filler material 120 may be a micro platelet being defined by a length L, a width W, and a thickness T. In an embodiment of the present description, the filler material 120 may have a high aspect ratio, wherein the length L is at least ten (10) times greater than the thickness T and/or the width W is at least ten (10) times greater than the thickness T. In one embodiment of the present description, the filler material 120, i.e., the micro platelet, may be graphitic carbon. In a further embodiment of the present description, the thickness T may be greater than one micron. As will be understood to those skilled in the art, having the thickness T greater than one micron may decrease excessive phonon scattering at surfaces and/or interfaces and may provide a cost benefit compared with having the thickness T being less than one micron.

Figure 2:
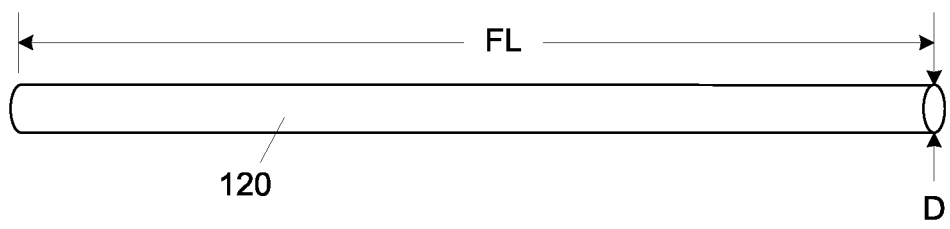
FIG. 2 is an oblique view of a graphitic carbon filler particle, according to another embodiment of the present description.

As shown in FIG. 2, in a further embodiment of the present description, a single particle of the filler material 120 may be a micro fiber being defined by a length FL and a diameter D. In an embodiment of the present description, the filler material 120 may have a high aspect ratio, wherein the length FL of the micro fiber is at least ten (10) times greater than the diameter D. In one embodiment of the present description, the micro fiber may be graphitic carbon. In a further embodiment of the present description, the diameter D may be greater than one micron. As will be understood to those skilled in the art and as discussed with regard to the embodiment of FIG. 1, having the diameter D greater than one micron may decrease excessive phonon scattering at surface and/or interfaces and may provide a cost benefit compared with having the diameter D being less than one micron.

Figure 3:
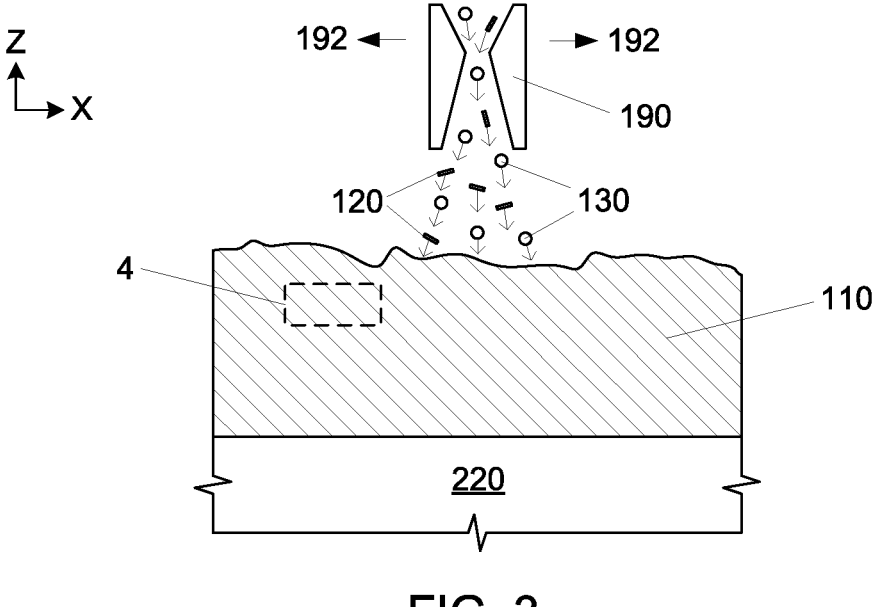
FIG. 3 is a side cross-sectional view of forming a metal matrix composite material layer on a substrate, according to an embodiment of the present description.

As shown in FIG. 3, a metal matrix composite layer 110 may be formed on a substrate 220. The metal matrix composite layer 110 may be formed by an additive process, such as high throughput additive manufacturing ("HTAM"). In one embodiment, the metal matrix composite layer 110 may be formed with a "coldspray" HTAM process. As the coldspray process is known in the art, it will be only concisely discussed herein. With a coldspray process, solid powders of a desired material or materials, such as the filler material 120 and a metal material 130, to be deposited are accelerated in a carrier jet (e.g., compressed air or nitrogen) by passing the jet through a converging diverging nozzle 190. The jet exits the nozzle 190 at a high velocity and reaches the underlying substrate 220, where the impact causes the solid particles, such as the filler material 120 and/or the metal material 130, in the jet to plastically deform and bond to the substrate 220. Subsequent layers of the filler material 120 and the metal material 130 similarly adhere to each underlying layer upon continued jet impact, producing fast buildup (e.g., layers that are a few hundred microns thick can be deposited over an area of about 100-1000 mm² in a few seconds). The nozzle 190 may be moved (shown as arrows 192) across the substrate 220 during the spray process. Moreover, unlike thermal spraying techniques, this approach does not require melting the particles (e.g., the filler material 120 and/or the metal particles 130), thus protecting both the materials and the substrate 220 from experiencing excessive processing temperatures. In one embodiment of the present description, the metal matrix composite layer 110 may be formed at a temperature below about 150 degrees Celsius. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art.

In one embodiment of the present description, the filler material 120 may be a graphitic carbon having a thermal conductivity greater than about 400 W/mK and having a coefficient of thermal expansion of between about 2 and 6 ppm/K. In an embodiment of the present description, the metal material 130 may include, but is not limited to copper, aluminum, nickel, silver, gold, alloys thereof, and the like.

Figure 4:
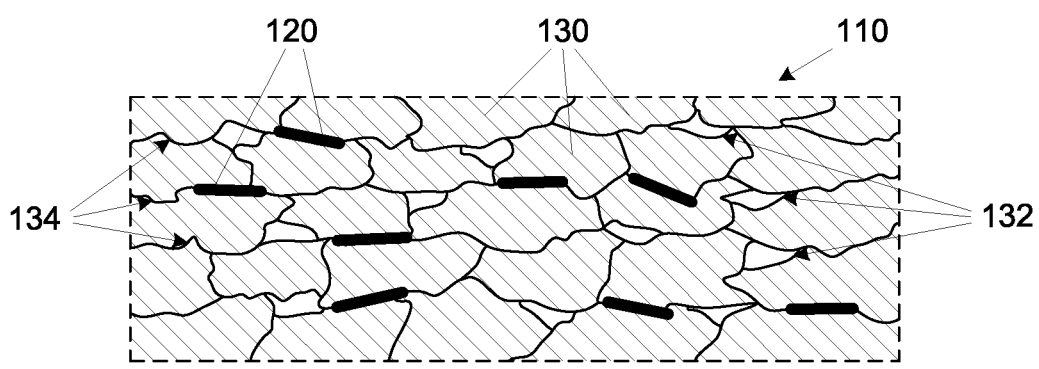
FIG. 4 is a side cross-sectional view of the inset 4 for FIG. 3, according to one embodiment of the present description.

FIG. 4 illustrates the inset 4 in FIG. 3 and further illustrates deposition of the filler material 120 and the metal material 130 to form the metal matrix composite layer 110, in accordance with some embodiments of the HTAM process, as previously discussed. As shown, the microstructure of metal matrix composite layer 110 comprises deformed metal material 130 layered in a lamellar structure/manner, the filler material 120 between the metal material 130, and voids 132. At sufficient magnification, boundaries 134 between the metal material 130 are apparent, as distinguished from atomic deposition processes, such as plating. The lamellar structure of the metal material 130 may be evident within the metal matrix composite layer 110, which are indicative of the impact between the metal material 130 and the foundation substrate 220 (see FIG. 3) and between the metal material 130 and the previous deposited metal material 130, where most of the metal material 130 plastically deform and flatten. As such, the filler material 120 may align along the boundaries 134.

Figure 5:
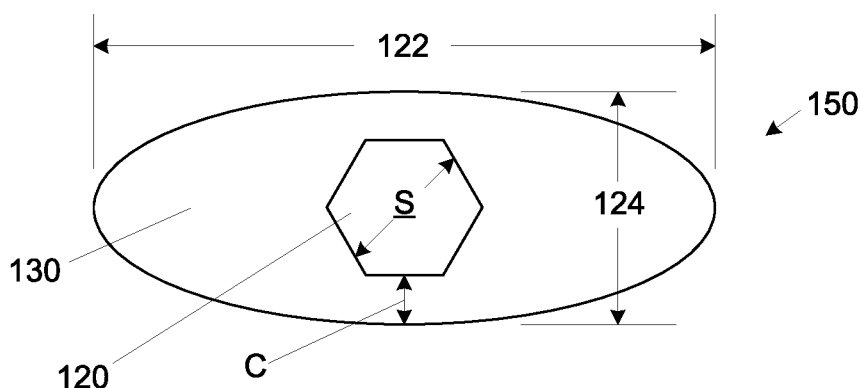
FIG. 5 is a side cross-sectional view of a metal clad filler particle, according to one embodiment of the present description.

As shown in FIG. 5, in one embodiment of the present description, a single particle of the filler material 120 may be clad or coated in the metal material 130 to form a cladded particle 150. In one embodiment of the present description, the filler material 120 may be a diamond. In an embodiment of the present description, the filler material 120 may have an average diameter or size S of between about 10 and 200 microns. The cladding of metal material 130 may be any appropriate metal, including, but not limited to, copper, nickel, aluminum, silver, gold, alloys thereof, and the like. In one embodiment of the present description, the cladding of metal material 130 may have a minimum thickness C of about 2 microns. In a further embodiment of the present description, the cladding of metal material 130 may be an ellipse having an aspect ratio of a major axis length 122 to a minor axis length 124 of greater than 1. The cladding of the metal material 130 may be achieved by electrolytic or electroless plating, physical vapor deposition (e.g., sputtering or evaporation), chemical vapor deposition, or the like. It is understood that unclad diamonds as the filler material 120 may have low retention in the metal matrix composite layer 110. Furthermore, unclad diamonds may fracture in the cold spray process, and would, thus, has limited benefit of thermal conductivity and coefficient of thermal expansion enhancement due to these defects.

Figure 6:
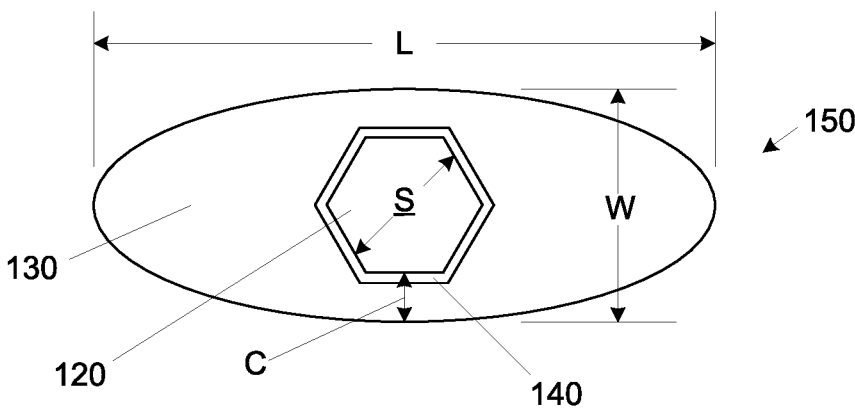
FIG. 6 is a side cross-sectional view of a metal clad filler particle, according to another embodiment of the present description.

As shown in FIG. 6, in a further embodiment of the present description, the single particle of the filler material 120 may have a coating of a bonding layer 140. In an embodiment of the present description, the bonding layer 140 may be a metal, including, but not limited to, tungsten, chromium, nickel, molybdenum, titanium, alloys thereof, carbides thereof (including, but not limited to, chromium carbide, titanium carbide, and molybdenum carbide) and the like. In one embodiment of the present description, the thickness of the bonding layer 140 may be less than about 1 micron.

As shown in FIG. 7, the metal matrix composite layer 110 may be formed on a substrate 220. The metal matrix composite layer 110 may be formed by an additive process, such as high throughput additive manufacturing ("HTAM"). In one embodiment, the metal matrix composite layer 110 may be formed with a "coldspray" HTAM process in the manner previously discussed. The cladded particles 150 are accelerated in a carrier jet (e.g., compressed air or nitrogen) by passing the jet through the converging diverging nozzle 190. The jet exits the nozzle 190 at a high velocity and reaches the underlying substrate 220, where the impact causes the cladded particles 150 in the jet to plastically deform and bond to the substrate 220. Subsequent layers of the cladded particles 150 similarly adhere to each underlying layer upon continued jet impact. The nozzle 190 may be moved (shown as arrows 192) across the substrate 220 during the spray process. In one embodiment of the present description, the metal matrix composite layer 110 may be formed at a temperature below about 150 degrees Celsius.

As previously discussed, diamonds are susceptible to fracturing when they are deposited unclad. However, a balance must be struck between protecting the filler material 120 with enough metal material 130 and having too much metal material 130 in the overall metal matrix composite layer 110. The elliptical shape of the metal material 130 on filler material 120, as shown in FIGS. 5-7, can achieve this balance. As shown in FIG. 7, when the cladded particles 150 are sprayed, they aerodynamically orient themselves such that the major axis is substantially perpendicular to the surface upon which it is being sprayed, such that the thickest portion of the metal material 130 impacts and protects the filler material 120. Thus, less metal material 130 is needed when compared to spherically coating the metal material 130 on the filler material 120, as will be understood to those skilled in the art.

In one embodiment of the present description, the filler material 120 may be diamonds having a thermal conductivity greater than about 1000 W/mK and having a coefficient of thermal expansion of about 1.1 ppm/K. In an embodiment of the present description, the metal material 130 may include, but is not limited to copper, aluminum, nickel, silver, gold, alloys thereof, and the like.

FIG. 8 illustrates the inset 8 in FIG. 7 and further illustrates deposition of the filler material 120 and the metal material 130 to form the metal matrix composite layer 110, in accordance with some embodiments of the HTAM process, as previously discussed. As shown, the microstructure of metal material composite layer 110 comprises deformed metal material 130 layered in a lamellar structure/manner, the filler material 120 between the metal material 130, and voids 132. At sufficient magnification, boundaries 134 between the metal material 130 are apparent, as distinguished from atomic deposition processes, such as plating. The lamellar structure of the metal material 130 may be evident within the metal matrix composite layer 110, which are indicative of the impact between the metal material 130 and the foundation substrate 220 (see FIG. 3) and between the metal material 130 and the previous deposited metal material 130, where most of the metal material 130 plastically deform and flatten. As will be understood, since the filler material 120 is clad with the metal material 130, it will generally remain encased in the metal material 130 even after deposition.

FIG. 9 illustrates an integrated circuit assembly 200 having at least one integrated circuit device 220 (i.e., the substrate 220 of FIGS. 3, 7, and 9-12) electrically attached to an electronic substrate 210 in a configuration generally known as a flip-chip or controlled collapse chip connection ("C4") configuration, according to an embodiment of the present description.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). These conductive traces and conductive vias are well known in the art and are not shown in FIG. 9 for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 210 may be a cored substrate or a coreless substrate. In one embodiment of the present description, the electronic substrate 210 may comprise a silicon or glass interposer. In another embodiment of the present description, the electronic substrate 210 may include active and/or passive devices.

The integrated circuit device 220 may be any appropriate device, including, but not limited to, a microprocessor, a chipset, a graphics device, a wireless device, a memory device, an application specific integrated circuit, combinations thereof, stacks thereof, or the like. Furthermore, the integrated circuit device 220 may be a monolithic die or a die stack that can consist of two or more vertical levels of dice stacked on top of each other, and may include additional materials, such as a mold compound, between at least two of the dice. As shown, the integrated circuit device 220 may each have a frontside surface 222 and an opposing backside surface 224.

In one embodiment of the present description, a metallization structure 250 may be formed on the backside surface 224 of the first integrated circuit device 220. The metallization structure 250 may include the metal matrix composite layer 110 as previously discussed and illustrated with regard to FIGS. 1-8.

In an embodiment of the present description, the integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the frontside surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material. In still a further embodiment, the device-to-substrate interconnects 232 may be anisotropic conductive film.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, such as those discussed with regard to the device-to-substrate interconnects 232, as previously discussed. The external interconnects 240 may be used to attach the integrated circuit assembly 200 to an external substrate (not shown), such as a motherboard.

An electrically-insulating underfill material 242, such as an epoxy material, may be disposed between the integrated circuit device 220 and the electronic substrate 210. The underfill material 242 may be used to overcome the mechanical stress issues that can arise from thermal expansion mismatch between the electronic substrate 210 and the integrated circuit device 220. As will be understood to those skilled in the art, the underfill material 242 may be dispensed between the frontside surface 222 of the integrated circuit devices 220 and the electronic substrate 210 as a viscous liquid and then hardened with a curing process.

As will be understood, the integrated circuit assembly 200 may further include a heat dissipation device (not shown) thermally attached to the metallization structure 250. The heat dissipation device may be a heat pipe, a vapor chamber, a liquid cooling device, a cold plate, and the like.

Figure 10:
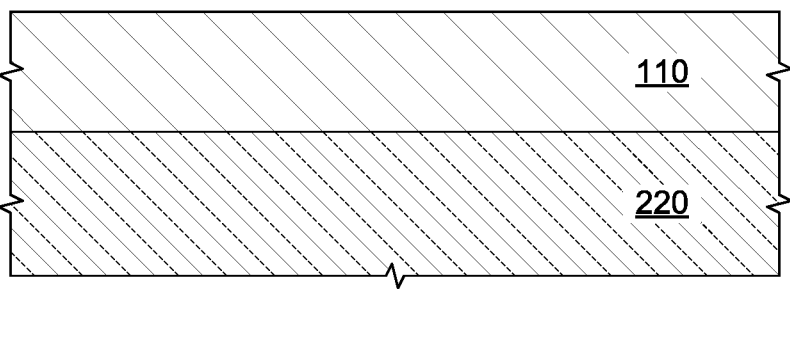
FIG. 10 is a side cross-sectional view of a metal matrix composite layer formed directly on an integrated circuit device, according to an embodiment of the present description.
Figure 11:
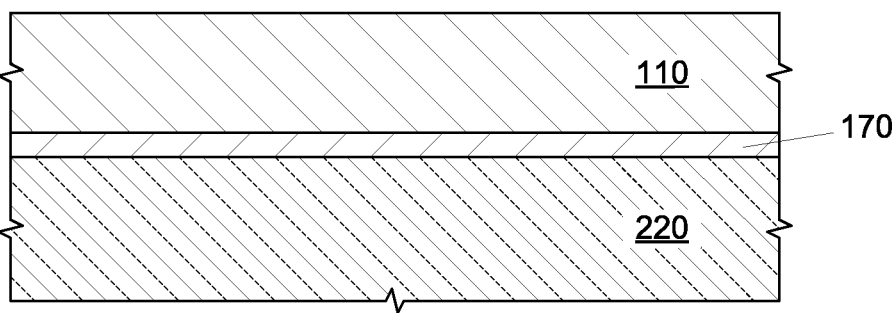
FIG. 11 is a side cross-sectional view of an intermediate layer formed between a metal matrix composite layer and an integrated circuit device, according to another embodiment of the present description.

In one embodiment of the present description, the metal matrix composite layer 110 may be formed to directly contact the backside surface 224 of the integrated circuit device or substrate 220, as shown in FIG. 10 (wherein the metal matrix composite layer 110 alone comprises the metallization structure 250 of FIG. 9). In other embodiments of the present description, at least one intermediate layer 170 may be formed between the backside surface 224 and the metal matrix composite layer 110, as shown in FIG. 11 (wherein the metal matrix composite layer 110 and the at least one intermediate layer 170 comprise the metallization structure 250 of FIG. 9). The intermediate layer 170 may be formed as a buffer layer to protect the integrated circuit device/substrate 220 from abrasion during deposition of the metal matrix composite layer 110, formed as a diffusion layer to prevent the metal matrix composite layer 110 from diffusing into the integrated circuit device/substrate 220, formed as an adhesion promotion layer, or formed for other purposes. Although the intermediate layer 170 is illustrated as a single layer in FIG. 11, it is understood that the intermediate layer 170 may consist of one or more layers of different materials. In one embodiment of the present description, the intermediate layer 170 may be any appropriate material, including, but not limited to, titanium, nickel, vanadium, gold, nitride materials, or combinations of those or other materials. In an embodiment of the present description, the intermediate layer may be between about 10 and 500 nanometers.

Figure 12:
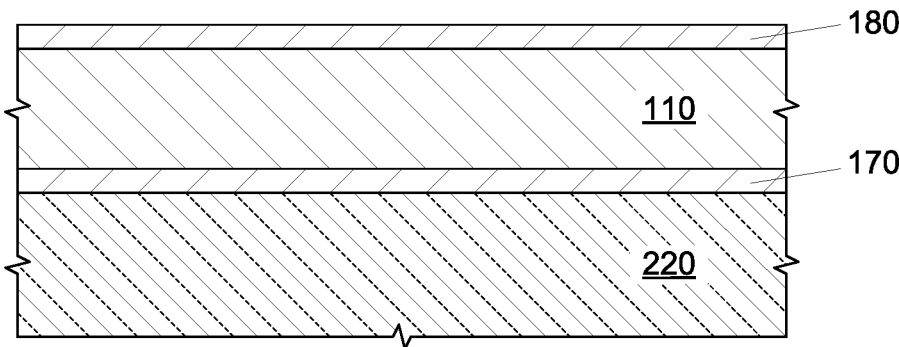
FIG. 12 is a side cross-sectional view of a capping layer formed on a metal matrix composite layer, according to still another embodiment of the present description.

Depending on the materials used, the metal matrix composite layer 110 may be susceptible to oxidation and/or corrosion over time. Thus, in one embodiment of the present description, a capping layer 180 may be deposited on the metal matrix composite layer 110 to protect against those risks, as shown in FIG. 12 (wherein the metal matrix composite layer 110, capping layer 180, and/or the intermediate layer 170 comprises the metallization structure 250 of FIG. 9). In one embodiment, the capping layer 180 may be any appropriate material, including, but not limited to, nickel, aluminum, silver, tungsten, vanadium, gold, titanium, and alloys thereof.

Figure 13:
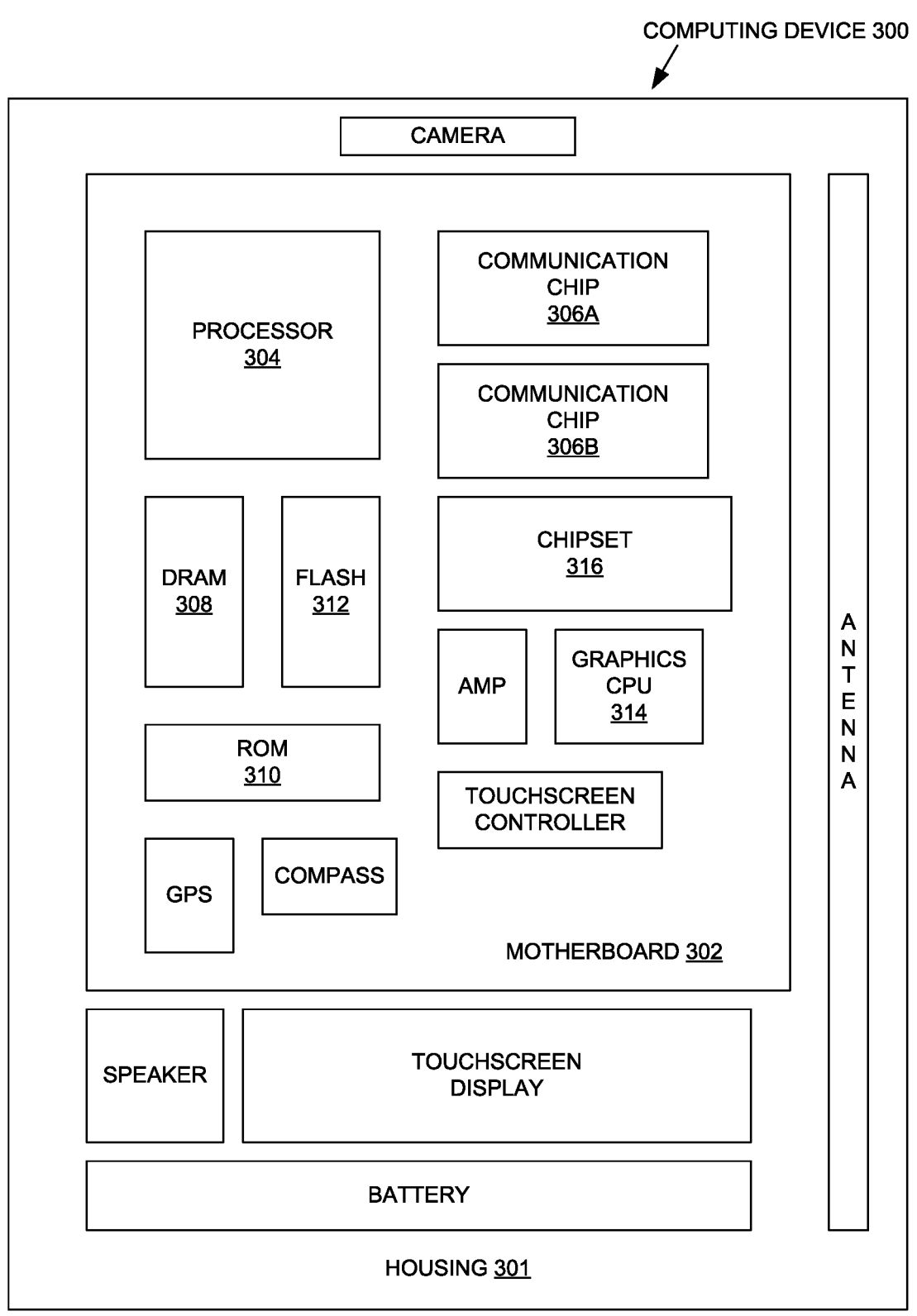
FIG. 13 is an electronic system, according to one embodiment of the present description.

FIG. 13 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit device having a metal matrix composite film formed on a backside surface thereof. The metal matrix composite film may comprise any of the embodiments of present description.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-13. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is a material composition comprising a metal material and a plurality of graphitic carbon filler particles, wherein the plurality of graphitic carbon filler particles has an average aspect ratio of greater than about 10.

In Example 2, the subject matter of Example 1 can optionally include the plurality of graphitic carbon filler particles comprising a plurality of platelets defined by a length, a width, and a thickness, wherein the average aspect ratio is defined by an average ratio between the thickness and one of the length and the width of the plurality of platelets.

In Example 3, the subject matter of Example 2 can optionally include the thickness of the plurality of platelets being greater than about 1 micron.

In Example 4, the subject matter of Example 1 can optionally include the plurality of graphitic carbon filler particles comprising a plurality of fibers defined by a length and a diameter, wherein the average aspect ratio is defined by an average ratio between the length and the diameter of the plurality of fibers.

In Example 5, the subject matter of Example 4 can optionally include the diameter of each of the fibers of the plurality of fibers is greater than about 1 micron.

In Example 6, the subject matter of any of Examples 1 to 5 can optionally include the metal material being selected from the group consisting of copper, aluminum, nickel, silver, gold, and alloys thereof.

Example 7 is a material composition comprising a plurality of diamond particles and a metal material, wherein the metal material clads each diamond particle of the plurality of diamond particles.

In Example 8, the subject matter of Example 7 can optionally include the metal material being an ellipse.

In Example 9, the subject matter of any of Examples 7 to 8 can optionally include the metal material being selected from the group consisting of copper, aluminum, nickel, silver, gold, and alloys thereof.

In Example 10, the subject matter of any of Examples 7 to 9 can optionally include a bonding layer between the metal material and each diamond particle of the plurality of diamond particles.

In Example 11, the subject matter of Example 10 can optionally include the bonding layer comprising a material selected from the group consisting of tungsten, chromium, nickel, silver, molybdenum, titanium, alloys thereof, and carbides thereof.

In Example 12, the subject matter of any of Examples 7 to 11 can optionally include the plurality of diamond particles having an average diameter of between about 10 and 200 microns.

Example 13 is an assembly comprising an integrated circuit device having a frontside surface and an opposing backside surface; and a metal matrix composite layer disposed on the backside surface of the integrated circuit device, wherein the metal matrix composite layer comprises material composition comprising a metal material and a plurality of graphitic carbon filler particles, wherein the plurality of graphitic carbon filler particles has an average aspect ratio of greater than about 10.

In Example 14, the subject matter of Example 13 can optionally include the plurality of graphitic carbon filler particles comprising a plurality of platelets defined by a length, a width, and a thickness, wherein the average aspect ratio is defined by an average ratio between the thickness and one of the length and the width of the plurality of platelets.

In Example 15, the subject matter of Example 14 can optionally include the thickness of the plurality of platelets being greater than about 1 micron.

In Example 16, the subject matter of Example 13 can optionally include the plurality of graphitic carbon filler particles comprising a plurality of fibers defined by a length and a diameter, wherein the average aspect ratio is defined by an average ratio between the length and the diameter of the plurality of fibers.

In Example 17, the subject matter of Example 16 can optionally include the diameter of each of the fibers of the plurality of fibers is greater than about 1 micron.

In Example 18, the subject matter of any of Examples 13 to 17 can optionally include the metal material being selected from the group consisting of copper, aluminum, nickel, silver, gold, and alloys thereof.

Example 19 is an assembly comprising an integrated circuit device having a frontside surface and an opposing backside surface; and a metal matrix composite layer disposed on the backside surface of the integrated circuit device, wherein the metal matrix composite layer comprises a plurality of metal particles layered in a lamellar structure and a plurality of diamond particle disposed within the metal particles.

In Example 20, the subject matter of Example 19 can optionally include the metal material being selected from the group consisting of copper, aluminum, nickel, silver, gold, and alloys thereof.

In Example 21, the subject matter of any of Examples 19 to 20 can optionally include a bonding layer between the metal material and each diamond particle of the plurality of diamond particles.

In Example 22, the subject matter of Example 21 can optionally include the bonding layer comprising a material selected from the group consisting of tungsten, chromium, nickel, silver, molybdenum, titanium, alloys thereof, and carbides thereof.

In Example 23, the subject matter of any of Examples 19 to 22 can optionally include the plurality of diamond particles having an average diameter of between about 10 and 200 microns.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An assembly comprising:
    an integrated circuit device having a frontside surface and an opposing backside surface; and
    a metal matrix composite layer in direct contact with the backside surface of the integrated circuit device, wherein the metal matrix composite layer comprises:
        a plurality of metal particles, each of the particles having a thickness in a direction perpendicular to the backside surface that is less than a length of the particle in a direction parallel to the backside surface and layered in the direction perpendicular the backside surface in a lamellar structure; and
        a plurality of graphitic carbon filler particles disposed at boundaries between the metal particles.

2. The assembly of claim 1, wherein each of the plurality of graphitic carbon filler particles comprises a platelet defined by a length, a width, and a thickness, wherein an average aspect ratio of each of the platelets is defined by an average ratio between the thickness and one of the length and the width of the plurality of platelets, and wherein the average aspect ratio is at least 10.

3. The assembly of claim 2, wherein the thickness, in a direction perpendicular to the backside surface of the integrated circuit device, of individual ones of the platelets is greater than 1 micron, and wherein a thickness of the metal matrix composite layer is at least one hundred microns.

4. The assembly of claim 1, wherein each of the plurality of graphitic carbon filler particles comprises a fiber defined by a length and a diameter, wherein an average aspect ratio is defined by an average ratio between the length and the diameter of the plurality of fibers, and wherein the average aspect ratio is at least 10.

5. The assembly of claim 4, wherein the average diameter of each of the fibers of the plurality of fibers is greater than about 1 micron.

6. The assembly of claim 1, wherein individual ones of the plurality of graphitic carbon filler particles has an average aspect ratio of greater than about 10, and wherein a longest length of individual ones of the filler particles is predominantly parallel to the backside surface of the integrated circuit, between adjacent lamellae.

7. The assembly of claim 1, wherein individual ones of the plurality of graphitic carbon filler particles has a coefficient of thermal expansion of between about 2 and 6 ppm/K.

8. The assembly of claim 1, wherein the metal particles include copper, aluminum, nickel, silver, or gold.

9. The assembly of claim 1, the metal matrix composite layer further comprises a plurality of voids between adjacent ones of the metal particles.

* * * * *